(12) United States Patent
Ohtomo

(10) Patent No.: US 10,662,282 B2
(45) Date of Patent: May 26, 2020

(54) GRAPHENE NANORIBBON, GRAPHENE NANORIBBON FABRICATION METHOD, AND SEMICONDUCTOR DEVICE

(71) Applicant: FUJITSU LIMITED, Kawasaki-shi, Kanagawa (JP)

(72) Inventor: Manabu Ohtomo, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 130 days.

(21) Appl. No.: 15/889,432

(22) Filed: Feb. 6, 2018

(65) Prior Publication Data
US 2018/0223038 A1    Aug. 9, 2018

(30) Foreign Application Priority Data

Feb. 8, 2017   (JP) .................. 2017-021020

(51) Int. Cl.
*C08G 61/12*   (2006.01)
*H01L 51/00*   (2006.01)
(Continued)

(52) U.S. Cl.
CPC .............. *C08G 61/12* (2013.01); *B82Y 30/00* (2013.01); *B82Y 40/00* (2013.01); *C01B 32/184* (2017.08); *C08G 61/122* (2013.01); *H01L 29/1606* (2013.01); *H01L 51/0045* (2013.01); *H01L 51/0541* (2013.01); *H01L 51/0545* (2013.01); *C08G 2261/11* (2013.01); *C08G 2261/13* (2013.01); *C08G 2261/228* (2013.01); *C08G 2261/3241* (2013.01); *C08G 2261/3242* (2013.01); *C08G 2261/724* (2013.01); *C08G 2261/91* (2013.01); *C08G 2261/92* (2013.01); *H01L 51/0558* (2013.01); *H01L 51/0579* (2013.01); *H01L 51/42* (2013.01)

(58) Field of Classification Search
CPC ....................................... C08G 61/12
USPC ....................................... 528/397
See application file for complete search history.

(56) References Cited

U.S. PATENT DOCUMENTS

2010/0224998 A1   9/2010   Duvall et al.
2012/0197051 A1   8/2012   Tour et al.
(Continued)

FOREIGN PATENT DOCUMENTS

| JP | 2014-236111 | 12/2014 |
|---|---|---|
| JP | 2015-502415 | 1/2015 |
| WO | 2013/061258 | 5/2013 |

OTHER PUBLICATIONS

EESR—Extended European Search Report (EESR) issued in corresponding European Application No. 18155338.9, dated Jun. 12, 2018.
(Continued)

*Primary Examiner* — Duc Truong
(74) *Attorney, Agent, or Firm* — Fujitsu Patent Center

(57) ABSTRACT

A graphene nanoribbon has a chiral edge to which a dicarbimide structure is bonded. The dicarbimide structure is an electron-withdrawing group. The width and band gap of the graphene nanoribbon are controlled by a precursor molecule used for a polymerization reaction. Furthermore, n-type operation of the graphene nanoribbon is realized by the dicarbimide structure. In addition, with the graphene nanoribbon, an increase in ribbon length and suppression of a polymerization defect by the stabilization of a reaction intermediate of the precursor molecule, as well as improvement in orientation are realized by the dicarbimide structure.

4 Claims, 11 Drawing Sheets

(51) Int. Cl.
   H01L 51/05   (2006.01)
   B82Y 40/00   (2011.01)
   B82Y 30/00   (2011.01)
   C01B 32/184  (2017.01)
   H01L 29/16   (2006.01)
   H01L 51/42   (2006.01)

(56) References Cited

U.S. PATENT DOCUMENTS

| | | |
|---|---|---|
| 2012/0261644 A1 | 10/2012 | Dimitrakopoulos |
| 2015/0057417 A1 | 2/2015 | Tour et al. |
| 2016/0118589 A1 | 4/2016 | Kagaya et al. |
| 2016/0207776 A1 | 7/2016 | Hintermann et al. |

OTHER PUBLICATIONS

Veronica Barone et al., "Electronic Structure and Stability of Semiconducting Graphene Nanoribbons", NANO Letters, vol. 6, No. 12, Nov. 2006, pp. 2748-2754 (7 pages).

Li Yang et al., "Quasiparticle Energies and Band Gaps in Graphene Nanoribbons", Physical Review Letters, vol. 99, Issue 18, 186801-1-186801-4, Nov. 2007 (4 pages).

Jinming Cai et al., "Atomically precise bottom-up fabrication of graphene nanoribbons", Nature, vol. 466, Jul. 22, 2010, pp. 470-473 (4 pages).

Hajo Sode et al., "Electronic band dispersion of graphene nanoribbons via Fourier-transformed scanning tunneling spectroscopy", Physical Review B, vol. 91, No. 4, 045429-1-045429-6, Jan. 2015 (6 pages).

Gianluca Fiori et al., "Simulation of Graphene Nanoribbon Field-Effect Transistors", IEEE Electron Device Letters, vol. 28, No. 8, Aug. 2007, pp. 760-762 (3 pages).

Yijian Ouyang et al., "Scaling Behaviors of Graphene Nanoribbon FETs: A Three-Dimensional Quantum Simulation Study", IEEE Transactions on Electron Devices, vol. 54, No. 9, Sep. 2007, pp. 2223-2231 (9 pages).

Cesar E. P. Villegas et al., "Optical spectrum of bottom-up graphene nanoribbons: towards efficient atom-thick excitonic solar cells", Scientific Reports, vol. 4, 6579, Oct. 2014, pp. 1-7 (7 pages).

Xuebin Tan et al., "Edge Effects on the pH Response of Graphene Nanoribbon Field Effect Transistors", The Jornal of Physical Chemistry C, vol. 117, Issue 51, Dec. 2013, pp. 27155-27160 (6 pages).

Patrick B. Bennett et al., "Bottom-up Graphene Nanoribbon Field-effect Transistors", Applied Physics Letters, vol. 103, No. 25, Dec. 2013 (5 pages).

S. Linden et al., "Electronic Structure of Spatially Aligned Graphene Nanoribbons on Au(788)", Physical Review Letters, vol. 108, Issue 21, 216801-1-216801-5, May 2012 (5 pages).

M. Liu et al., "Graphene-like nanoribbons periodically embedded with four- and eight-membered rings", Nature Communications, published Mar. 31, 2017, DOI: 10.1038/ncomms14924; pp. 1-7.

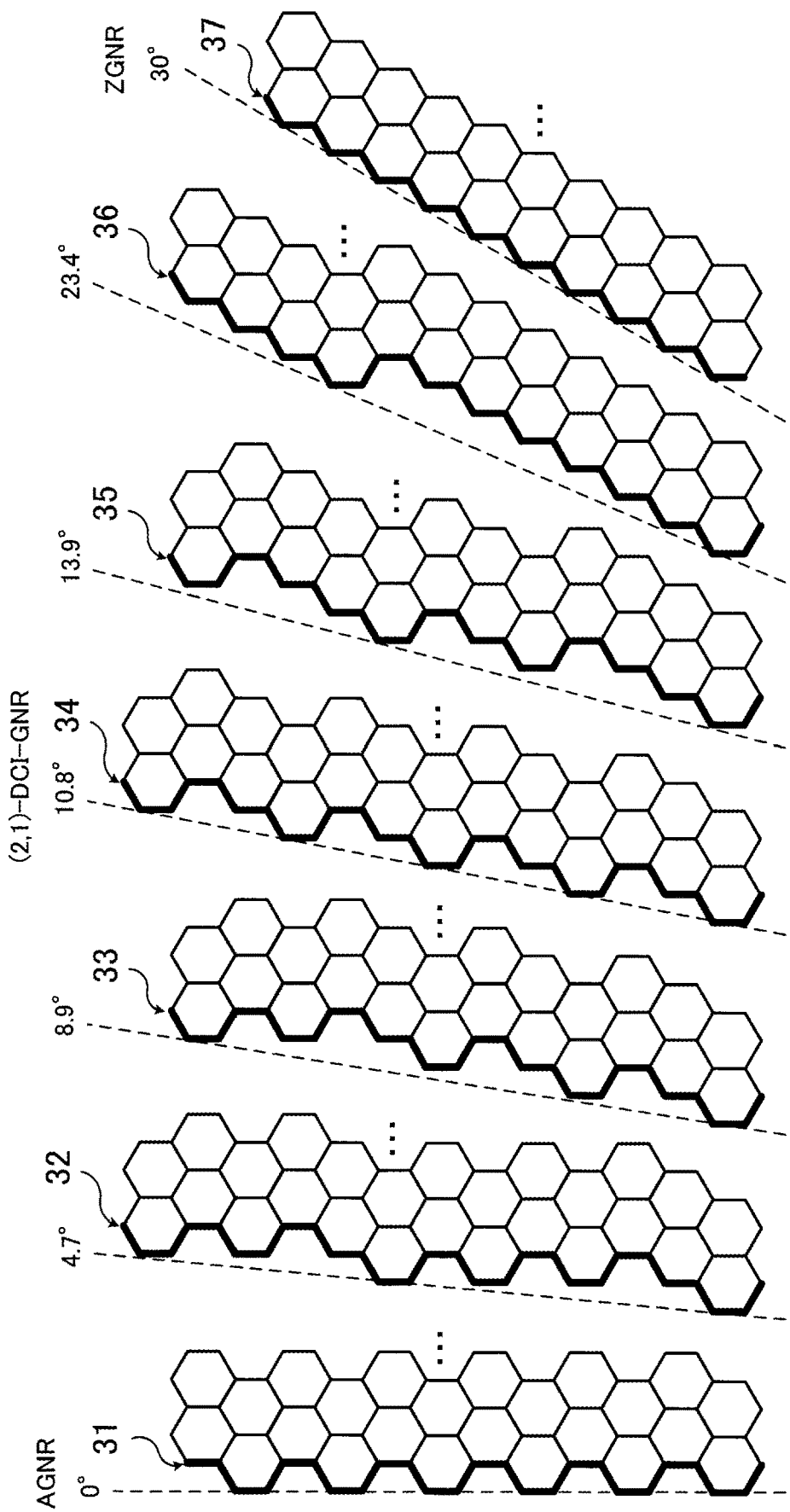

7-AGNR

Eg2 : 1.56eV
φ2 : 3.7eV

GRAPHENE NANORIBBON, GRAPHENE NANORIBBON FABRICATION METHOD, AND SEMICONDUCTOR DEVICE

CROSS-REFERENCE TO RELATED APPLICATION

This application is based upon and claims the benefit of priority of the prior Japanese Patent Application No. 2017-021020, filed on Feb. 8, 2017, the entire contents of which are incorporated herein by reference.

FIELD

The embodiments discussed herein are related to a graphene nanoribbon, a graphene nanoribbon fabrication method, and a semiconductor device.

BACKGROUND

A graphene nanoribbon is known as one of nanocarbon materials. In view of application of a graphene nanoribbon to semiconductor devices such as field effect transistors, there is an attempt to control its width and edge structure so as to obtain a semiconducting graphene nanoribbon having a band gap. For example, an armchair edge or a chiral edge is known as an edge structure of a semiconducting graphene nanoribbon.

See, for example, the following documents:
International Publication Pamphlet No. WO2013/061258; and
Verónica Barone, Oded Hod, and Gustavo E. Scuseria, "Electronic Structure and Stability of Semiconducting Graphene Nanoribbons", Nano Letters, Vol. 6, No. 12, pp. 2748-2754, 2006.

Applying a graphene nanoribbon to a semiconductor device does not always result in a high performance semiconductor device. The reason for this is that it is difficult to obtain a graphene nanoribbon having a shape and characteristics, such as a band gap, suitable for the semiconductor device.

SUMMARY

According to an aspect, there is provided a graphene nanoribbon having a chiral edge to which an electron-withdrawing group is bonded.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIGS. 2A through 2G are views for describing an edge structure of a graphene nanoribbon.

DESCRIPTION OF EMBODIMENTS

Figures 1A, 1B, 1C:
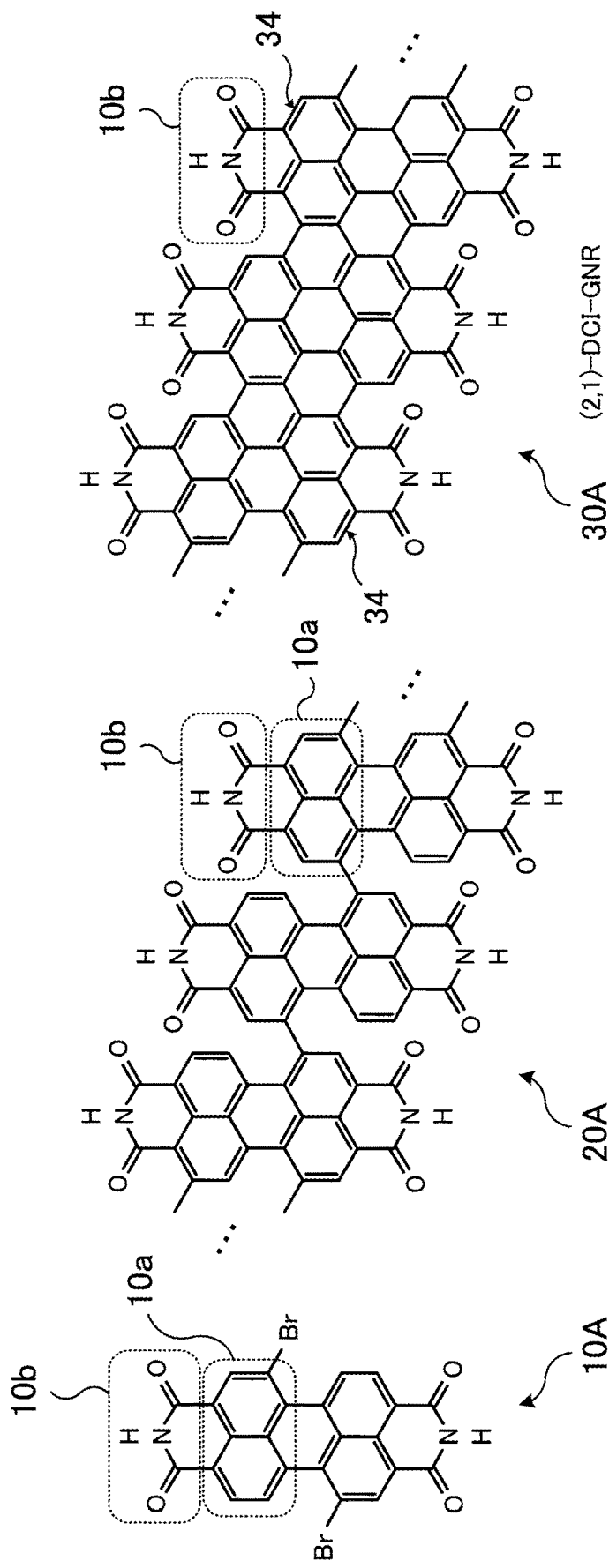
FIGS. 1A through 1C are views for describing an example of a graphene nanoribbon.

A first embodiment will be described.
A graphene nanoribbon according to a first embodiment has a structure represented by the following formula (1),

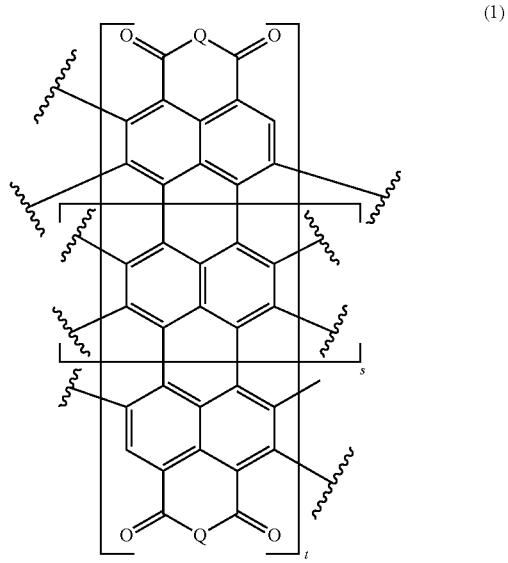

(1)

where Q is an NR group or an oxygen atom O. If Q is an NR group, then N is a nitrogen atom and R may be a hydrogen atom H, a halogen atom X (fluorine atom F, a chlorine atom Cl, a bromine atom Br, or an iodine atom I), a hydroxyl group (OH group), an amino group ($NH_2$ group), a cyano group (CN group), or a nitro group ($NO_2$ group). Furthermore, "R" of the NR group may be a 1-40C linear, branched, or cyclic and saturated or unsaturated hydrocarbyl group (or hydrocarbon group). In addition, the hydrocarbyl group may be mono-substituted or poly-substituted with at least one of a halogen atom X, an OH group, an $NH_2$ group, a CN group, and an $NO_2$ group or at least one methylene group ($CH_2$ group) of the hydrocarbyl group may be substituted with an oxygen atom O, a sulfur atom S, an ester group (COO group), or a carbonyl group (CO group). The hydrocarbyl group corresponding to "R" of the NR group is a phenyl group, a diisopropyl methyl group, a butylphenyl group, or the like. Moreover, a polymerization degree s is an integer in the range of 0 to 10 and a polymerization degree t is an integer in the range of 2 to 100000.

The edges (edges opposite each other in the width direction) of the graphene nanoribbon represented by formula (1) are chiral edges. Furthermore, an imide structure (dicarbimide structure (—CONRCO—)) or an acid anhydride structure (carboxylic acid anhydride structure (—COOCO—)) is bonded to the chiral edges of the graphene nanoribbon.

The graphene nanoribbon represented by formula (1) is formed by, for example, a bottom-up method (bottom-up synthesis). That is to say, the graphene nanoribbon represented by formula (1) is synthesized by polymerizing precursor molecules represented by the following formula (2),

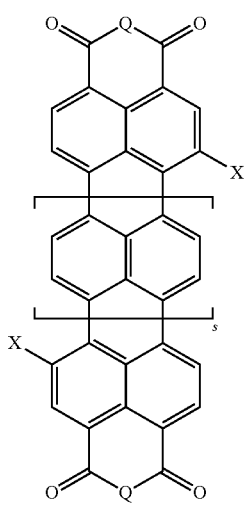

(2)

where X is a halogen atom and, as with formula (1), Q is an NR group or an oxygen atom O. If Q is an NR group, then N is a nitrogen atom and R may be a hydrogen atom H, a halogen atom X, an OH group, an $NH_2$ group, a CN group, or an $NO_2$ group. Furthermore, "R" of the NR group may be a 1-40C linear, branched, or cyclic and saturated or unsaturated hydrocarbyl group. In addition, the hydrocarbyl group may be mono-substituted or poly-substituted with at least one of a halogen atom X, an OH group, an $NH_2$ group, a CN group, and an $NO_2$ group or at least one $CH_2$ group of the hydrocarbyl group may be substituted with an oxygen atom O, a sulfur atom S, a COO group, or a CO group. The hydrocarbyl group corresponding to "R" of the NR group is a phenyl group, a diisopropyl methyl group, a butylphenyl group, or the like. Moreover, a polymerization degree s is an integer in the range of 0 to 10.

The precursor molecule represented by formula (2) has the following molecular structure. A plurality of naphthalene structure parts each containing a group of benzene rings arranged in a horizontal direction (first direction) is polymerized in a vertical direction (second direction). A halogen atom x and an electron-withdrawing group (an imide structure or an acid anhydride structure) are bonded to determined carbon sites of terminal naphthalene structure parts. A halogen atom is bonded to 3-position and 7-position carbon atoms (β-position carbon atoms at the edges in the first direction) of the terminal naphthalene structure parts and electron-withdrawing groups are bonded to 1-position and 8-position carbon atoms and 4-position and 5-position carbon atoms (group of α-position carbon atoms at the edges in the second direction) of the terminal naphthalene structure parts.

An aromatic compound which is represented by formula (2) and in which the halogen atom x and the electron-withdrawing group are bonded to determined carbon sites is used as precursor molecules used for forming the graphene nanoribbon represented by formula (1) by the bottom-up synthesis.

With the bottom-up synthesis, first precursor molecules represented by formula (2) are deposited over a heated substrate containing a catalytic metal in a vacuum (vacuum deposition). This vacuum deposition is performed at a temperature of, for example, about 200 to 300° C. When the vacuum deposition is performed, a plurality of precursor molecules is polymerized by a dehydrohalogenation (HX) reaction among the precursor molecules deposited over the substrate to form a polymer chain of an aromatic compound. The polymer chain formed by the vacuum deposition is heated further in a vacuum at a higher temperature (high temperature heating). This high temperature heating is performed at a temperature of, for example, about 350 to 450° C. When this high temperature heating is performed, aromatization (cyclization) progresses in the polymer chain of the aromatic compound over the substrate by a dehydrogenation reaction. The graphene nanoribbon represented by formula (1) is formed by the dehydrohalogenation reaction and dehydrogenation reaction of the precursor molecules.

Usually the width of a graphene nanoribbon has an influence on its band gap. There is a tendency for the band gap of a graphene nanoribbon to become smaller as its width increases. The width of the graphene nanoribbon represented by formula (1) is controlled by the size of the precursor molecule represented by formula (2), that is to say, by a polymerization degree s of naphthalene structure parts. As a result, its band gap is controlled.

The edges of the graphene nanoribbon represented by formula (1) and formed by the use of the precursor molecule represented by formula (2) are not armchair edges but chiral edges with low symmetry. The small width graphene nanoribbon having such chiral edges realizes a small band gap, compared with a graphene nanoribbon having armchair edges.

Furthermore, an imide structure or an acid anhydride structure is bonded to the chiral edges of the graphene nanoribbon represented by formula (1) and formed by the use of the precursor molecule represented by formula (2). Both of the imide structure or the acid anhydride structure function as electron-withdrawing groups. As a result, with the graphene nanoribbon having the chiral edges, the position of a conduction band is energetically deep, compared with a graphene nanoribbon having armchair edges. As a result, a work function increases. This enables n-type operation of the graphene nanoribbon by connecting as an electrode metal, such as titanium (Ti), whose work function is comparatively low.

It is expected that an electron-withdrawing group has the resonance effect of delocalizing and stabilizing radicals. This improves the stability (lifetime) of a reaction intermediate. The reaction intermediate is a biradical produced by separating the halogen atom X from the precursor molecule. If reaction intermediates are stabilized, the diffusion length of precursor molecules (reaction intermediates) over the substrate increases and the polymerization degree t increases. Therefore, it is expected that the ribbon length of the graphene nanoribbon increases.

Furthermore, if reaction intermediates are stabilized, a bond is easily cleaved from a polymer chain under reaction. As a result, a precursor molecule (reaction intermediate) is easily separated from over the substrate. That is to say, even if precursor molecules are bonded together in an undesirable form and a polymerization defect appears, the possibility that precursor molecules at a defective site are separated and that precursor molecules are bonded together anew in a desirable form at the site increases. A polymerization defect prevents the graphene nanoribbon from lengthening. Therefore, a process for correcting such a polymerization defect is important.

In addition, an imide structure or an acid anhydride structure which functions as an electron-withdrawing group contains a nitrogen atom N and an oxygen atom O which are acceptors of a hydrogen bond. Therefore, self-organization of adjacent graphene nanoribbons occurs by the hydrogen bond. This improves the orientation of the graphene nanoribbons.

As has been described, with the small width graphene nanoribbon represented by formula (1) and having chiral edges, a small band gap is realized and n-type operation is realized by an increase in work function caused by an electron-withdrawing group bonded thereto. Furthermore, a graphene nanoribbon with long ribbon length and good orientation in which a polymerization defect is suppressed is realized by the electron-withdrawing group.

Formula (2) indicates as an example a precursor molecule having a basic structure in which naphthalene structure parts are polymerized. However, another precursor molecule may be used for forming a graphene nanoribbon having chiral edges. A precursor molecule having a basic structure in which acene structure parts, such as anthracene structure parts, tetracene structure parts, or pentacene structure parts, are polymerized may be used for forming a graphene nanoribbon having a chiral edge. In this case, a chiral edge having a periodic structure corresponding to the number of benzene rings contained in a terminal acene structure part of a precursor molecule is formed in a graphene nanoribbon.

Concrete examples of the above graphene nanoribbon and a precursor molecule used for forming the above graphene nanoribbon will now be described as second and third embodiments.

First, a second embodiment will be described.

FIGS. 1A through 1C are views for describing an example of a graphene nanoribbon. FIG. 1A illustrates an example of a precursor molecule of a graphene nanoribbon. FIG. 1B indicates an example of a polymer (polymer chain) of the precursor molecule. FIG. 1C illustrates an example of a graphene nanoribbon.

For example, a precursor molecule 10A having a structure illustrated in FIG. 1A is used for forming a graphene nanoribbon 30A. The precursor molecule 10A illustrated in FIG. 1A has a structure in which X and Q in formula (2) are a bromine atom Br and an NH group respectively and in which the polymerization degree s is 0 and is 1,7-dibromoperylene-3,4:9,10-bis(dicarbimide). The above precursor molecule 10A is used and bottom-up synthesis is performed.

With the bottom-up synthesis, first the precursor molecule 10A is vacuum-deposited over a heated catalytic metal substrate. A (111) plane, a (110) plane, a (100) plane, or a high index plane, such as a (788) plane, of gold (Au), silver (Ag), copper (Cu), or the like is used as the catalytic metal substrate. Description will now be given with an Au (111) plane as an example. The Au (111) plane purified in an ultrahigh vacuum is kept at a temperature of about 200 to 300° C. and the precursor molecule 10A is vacuum-deposited thereover. At this time it is desirable to control a deposition amount so that about one-molecule layer will be formed. Polymerization of precursor molecules 10A progresses over the Au (111) plane by a dehydrohalogenation reaction by which hydrogen bromide HBr is separated from adsorbed precursor molecules 10A. As a result, a polymer 20A illustrated in FIG. 1B is formed.

After the above vacuum deposition, the Au (111) plane over which the polymer 20A is formed is heated in a vacuum at a higher temperature of about 350 to 450° C. This high temperature heating causes in the polymer 20A over the Au (111) plane a dehydrogenation reaction by which hydrogen $H_2$ is separated from precursor molecules 10A, and aromatization progress. As a result, the graphene nanoribbon 30A illustrated in FIG. 1C is formed.

The graphene nanoribbon 30A has a chiral edge 34 at which two benzene rings of a naphthalene structure part 10a of the precursor molecule 10A and one benzene ring formed by aromatization of precursor molecules 10A are arranged alternately and periodically. A dicarbimide structure 10b is bonded to the two benzene rings of the naphthalene structure part 10a. The dicarbimide structure 10b is periodically bonded to a carbon atom of the chiral edge 34 via a plurality of (three, in this example) carbon atoms. In the following description the graphene nanoribbon (GNR) 30A of FIG. 1C having the chiral edge 34 to which the dicarbimide (DCI) structure 10b is bonded may be represented by "(2, 1)-DCI-GNR".

FIGS. 2A through 2G are views for describing an edge structure of a graphene nanoribbon.

FIG. 2D illustrates the chiral edge 34 of the graphene nanoribbon 30A illustrated in FIG. 1C. In addition, FIGS. 2A through 2C and 2E through 2G illustrate an armchair edge 31, other chiral edges 32, 33, 35, and 36, and a zigzag edge 37, respectively, for comparison.

It is assumed that an angle of the armchair edge 31 of a graphene nanoribbon (AGNR) is 0° (FIG. 2A). Then an angle of the zigzag edge 37 of a graphene nanoribbon (ZGNR) is 30° (FIG. 2G).

Angles of the chiral edges 32 through 36 are in the range of 0°, which is the angle of the armchair edge 31, to 30°, which is the angle of the zigzag edge 37. As illustrated in FIGS. 2B through 2F, the chiral edges 32 through 36 form angles of 4.7° (FIG. 2B), 8.9° (FIG. 2C), 10.8° (FIG. 2D), 13.9° (FIG. 2E), and 23.4° (FIG. 2F), depending on their shapes. The angle of the chiral edge 34 of the graphene nanoribbon 30A ((2, 1)-DCI-GNR) illustrated in FIG. 1C is 10.8° (FIG. 2D).

A band gap of a graphene nanoribbon increases or decreases slightly according to its width. Generally speaking, however, there is the following correlation between an edge angle and a band gap of a graphene nanoribbon. A band gap of a graphene nanoribbon decreases as its edge angle increases (see the above "Electronic Structure and Stability of Semiconducting Graphene Nanoribbons"). Adoption of (2, 1)-DCI-GNR having the chiral edge 34 whose angle is 10.8° realizes a small band gap, compared with the AGNR having the armchair edge 31 and approximately the same width.

FIGS. 3A, 3B, 4A, and 4B are views for describing the band structure of a graphene nanoribbon.

Figure 3A:
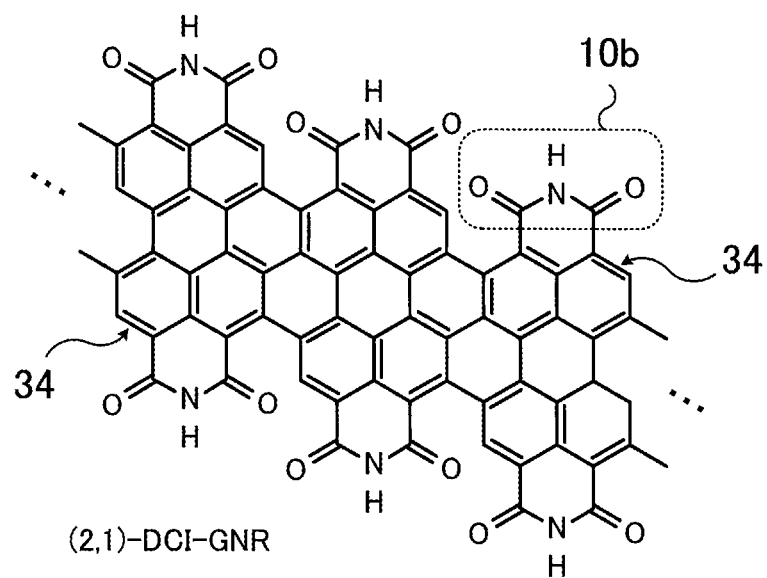
FIGS. 3A and 3B are views for describing the band structure of a graphene nanoribbon (part 1)
Figure 3B:
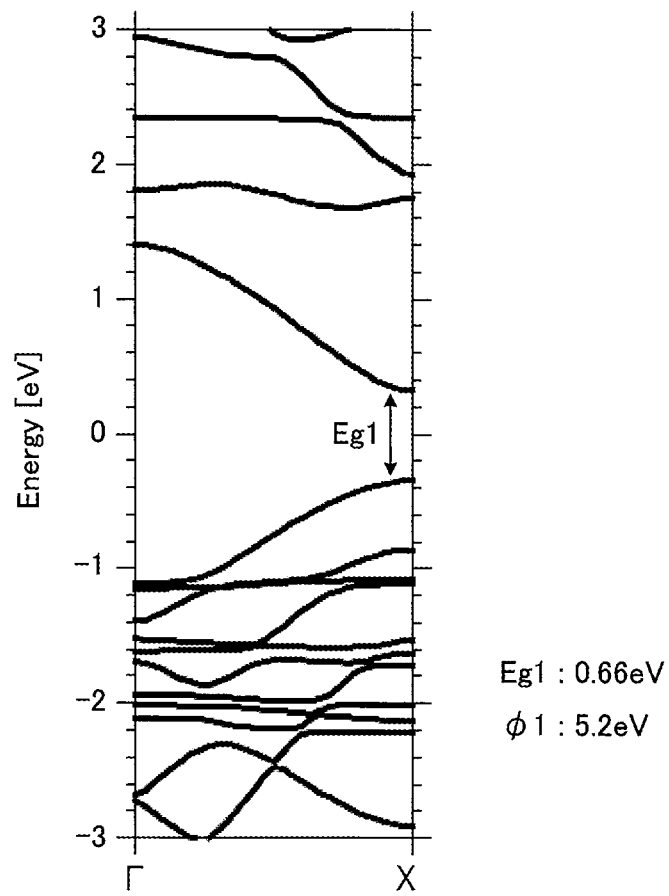

FIG. 3A illustrates the structure of (2, 1)-DCI-GNR and FIG. 3B illustrates a result obtained by estimating its band structure by a density functional method. For comparison, FIG. 4A illustrates the structure of an AGNR (7-AGNR) having width corresponding to seven carbon atoms and FIG. 4B illustrates a result obtained by estimating its band structure by the density functional method.

For example, the 7-AGNR is formed by forming a polymer chain by polymerization of anthracene dimers (precursor molecules) to which a halogen atom is bonded and aromatizing the polymer chain after that.

Figure 4A:
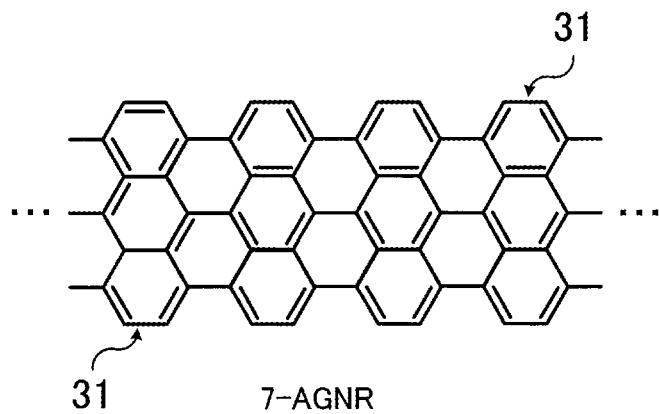
FIGS. 4A and 4B are views for describing the band structure of a graphene nanoribbon (part 2)
Figure 4B:
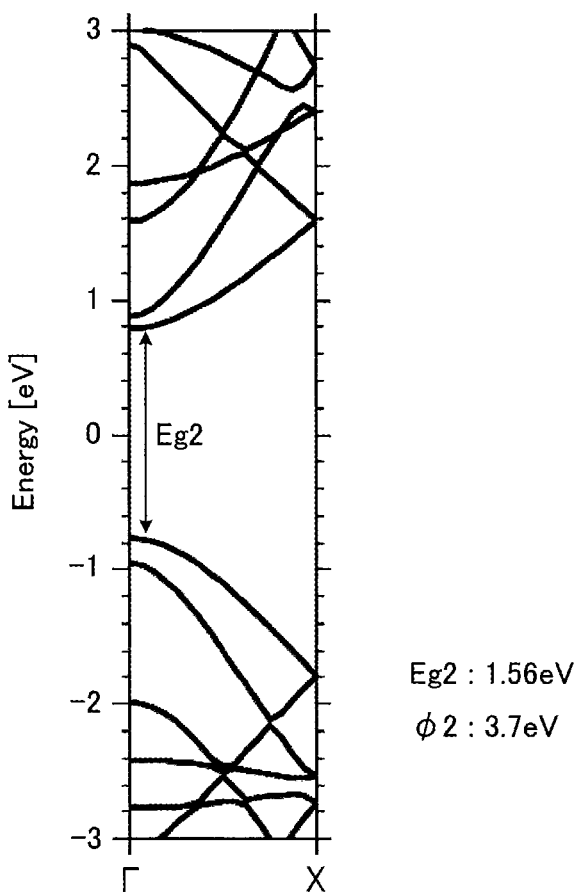

In FIGS. 4A and 4B, a band gap $Eg2$ of the 7-AGNR is estimated to be 1.56 eV. This value is smaller than a value experimentally reported. This is a known problem as the limit of the density functional method in the case of estimating a band gap of a graphene nanoribbon. However, it is possible to correctly estimate a relative magnitude relationship. In FIGS. 3A and 3B, a band gap Eg1 of the (2, 1)-DCI-GNR is estimated by the density functional method to be 0.66 eV. The band gap Eg1 of the (2, 1)-DCI-GNR is smaller than half of the band gap Eg2 of the 7-AGNR.

As has been described, a small band gap is realized by the (2, 1)-DCI-GNR having the chiral edge 34 whose angle is 10.8° (FIG. 2D), compared with the 7-AGNR having the armchair edge 31 and approximately the same width. Alternatively, small width is realized by the (2, 1)-DCI-GNR, compared with an AGNR whose band gap is approximately the same. That is to say, a relatively small precursor molecule may be used in the bottom-up synthesis to obtain a band gap which is approximately the same as that of an AGNR.

Furthermore, a work function $\Phi 1$ of the (2, 1)-DCI-GNR and a work function $\Phi 2$ of the 7-AGNR are estimated by the density functional method to be 5.2 eV and 3.7 eV respectively. This means that the position of a conduction band of the (2, 1)-DCI-GNR is energetically deep due to the electron-withdrawing property of the dicarbimide structure 10b. Therefore, it is possible to easily realize n-type operation of the (2, 1)-DCI-GNR by connecting as an electrode metal whose work function is comparatively low.

The dicarbimide structure 10b is expected to have the effect of delocalizing and stabilizing radicals and significantly improving the stability of a reaction intermediate, namely the stability of a biradical produced by separating a bromine atom Br from the precursor molecule 10A, in this example.

FIGS. 5A through 5D are views for describing the stability of a molecule. FIGS. 5A through 5D illustrate the stability of radicals at the time of a dicarbimide structure, a fluorine atom F, or a dioxine structure (—OCCO—) being bonded to an anthracene structure part with a radical of the anthracene structure part corresponding to part of a precursor molecule of the 7-AGNR as a reference.

Figure 5A:
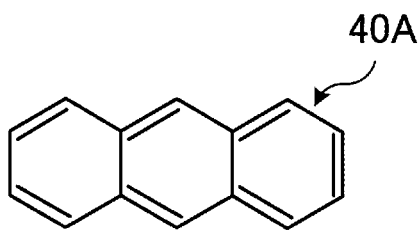
FIGS. 5A through 5D are views for describing the stability of a molecule.
Figure 5B:
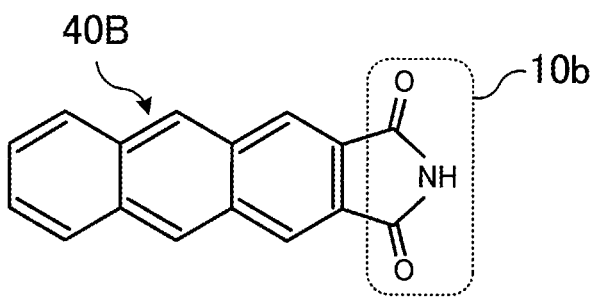
Figure 5C:
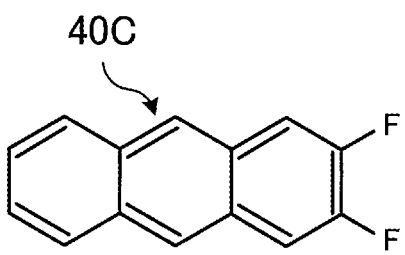
Figure 5D:
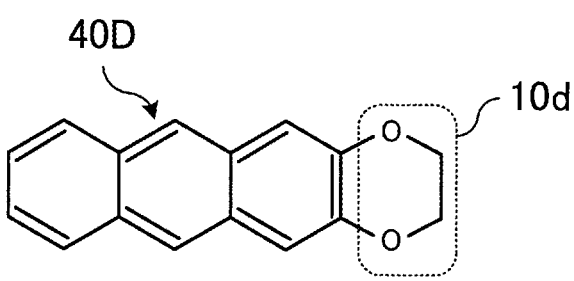

FIG. 5A illustrates anthracene 40A. FIG. 5B illustrates anthracene 40B to which a dicarbimide structure 10b is bonded. FIG. 5C illustrates anthracene 40C to which a fluorine atom F is bonded. FIG. 5D illustrates anthracene 40D to which a dioxine structure 10d is bonded.

If a radical of the anthracene 40A illustrated in FIG. 5A is considered as a reference (0 eV), then a radical of the anthracene 40B of FIG. 5B to which the dicarbimide structure 10b is bonded is 2.4 eV more stable than the radical of the anthracene 40A.

On the other hand, a radical of the anthracene 40C of FIG. 5C to which the fluorine atom F is bonded is 1.4 eV less stable than the radical of the anthracene 40A. A radical of the anthracene 40D of FIG. 5D to which the dioxine structure 10d is bonded is 1.3 eV less stable than the radical of the anthracene 40A.

From these factors, the above dicarbimide structure 10b of the precursor molecule 10A is expected to have the effect of improving the stability of a reaction intermediate of the precursor molecule 10A.

Because a reaction intermediate of the precursor molecule 10A is stabilized by the dicarbimide structure 10b, the diffusion length of reaction intermediates over a substrate increases. As a result, the ribbon length of the graphene nanoribbon 30A is increased.

Furthermore, because a reaction intermediate of the precursor molecule 10A is stabilized by the dicarbimide structure 10b, there is a high possibility that the reaction intermediate is separated from the polymer 20A and that a polymerization defect is corrected by its repolymerization to the polymer 20A. This suppresses a polymerization defect of the graphene nanoribbon 30A and therefore increases its ribbon length.

In addition, the dicarbimide structure 10b contains a nitrogen atom N and an oxygen atom O which are acceptors of a hydrogen bond. As a result, self-organization of adjacent graphene nanoribbons 30A occurs by a hydrogen bond. This improves the orientation of the graphene nanoribbons 30A.

As has been described, with the small width graphene nanoribbon 30A having the chiral edge 34, a small bang gap is realized. Also, n-type operation is realized by the electron-withdrawing property of the dicarbimide structure 10b. Furthermore, the graphene nanoribbon 30A with long ribbon length and good orientation in which a polymerization defect is suppressed is realized by the dicarbimide structure 10b.

The graphene nanoribbon 30A having the above characteristics is excellent in applicability to various semiconductor devices.

With a graphene nanoribbon having an armchair edge, it is easy to realize a comparatively large band gap. Therefore, if it is applied to, for example, a photoelectric conversion device, it is a good material. On the other hand, however, if it is applied to a field effect transistor (FET), it is difficult due to an excessively large band gap to obtain good bonding with an electrode. A band gap of a graphene nanoribbon tends to become smaller as its width increases. Therefore, in principle, a precursor molecule (its acene structure part) used in the bottom-up synthesis is made large to form a graphene nanoribbon with large width having an armchair edge. However, the large precursor molecule needs vacuum deposition at a high temperature for formation and is originally designed so as to have high reactivity. As a result, in many cases, the large precursor molecule decomposes in a deposition process. Therefore, it is not always easy to use a moderately large precursor molecule for obtaining a graphene nanoribbon having large width, a small band gap, and an armchair edge.

Furthermore, the length of conventional graphene nanoribbons having an armchair edge is about 20 nm on average. With an FET in which a graphene nanoribbon connects a source electrode and a drain electrode, channel length with a length of about 10 nm, at the most, can be fabricated by the use of the present microfabrication technology. If a contact area between a graphene nanoribbon and an electrode is not wide, then contact resistance increases. Therefore, with the present graphene nanoribbon having an armchair edge, the ribbon length is not always sufficient to ensure fabricable channel length and to ensure a contact area between the graphene nanoribbon and an electrode for making contact resistance low. In addition, if such a comparatively short graphene nanoribbon having an armchair edge grows with random orientation, it is difficult to fabricate FETs in which a graphene nanoribbon connects a source electrode and a drain electrode with a high yield. The orientation of a graphene nanoribbon is controllable by the use of a single crystal having a high index plane. However, this may lead to a significant increase in the costs.

In the second embodiment, on the other hand, a comparatively small precursor molecule 10A (in which an acene structure part and its polymerization degree are comparatively small) is used in the bottom-up synthesis. Even if such a precursor molecule 10A is used, the graphene nanoribbon 30A having a comparatively small band gap is obtained. This graphene nanoribbon 30A is suitable for an FET or the like. As a result, an increase in vacuum deposition temperature at bottom-up synthesis time or decomposition of a precursor molecule in a deposition process is suppressed, compared with a case where a large precursor molecule is used for realizing a small band gap. Furthermore, it is possible to stably obtain by the bottom-up synthesis the graphene nanoribbon 30A with comparatively long ribbon length and good orientation which is capable of n-type operation, while suppressing a polymerization defect. This makes it possible to fabricate high performance semiconductor devices, such as FETs, using the graphene nanoribbon 30A with a high yield, while suppressing an increase in the costs.

A third embodiment will now be described.

Figures 6A, 6B, 6C:
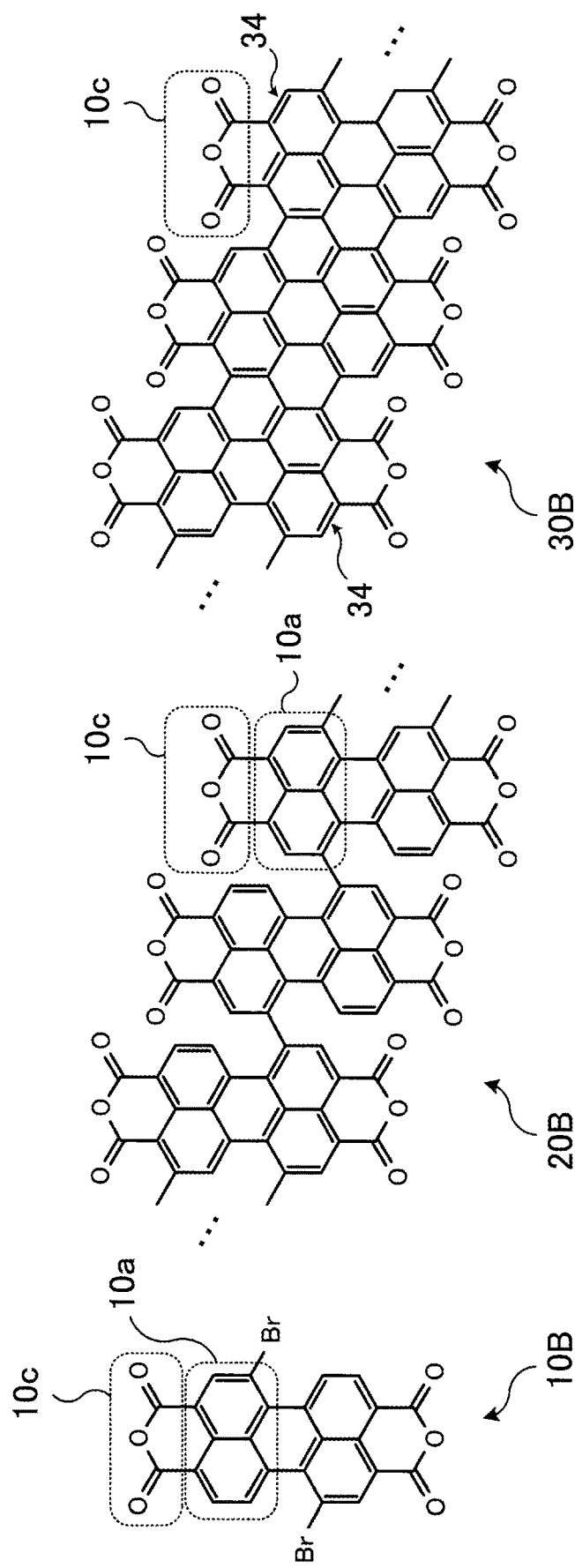
FIGS. 6A through 6C are views for describing another example of a graphene nanoribbon.

FIGS. 6A through 6C are views for describing another example of a graphene nanoribbon. FIG. 6A illustrates another example of a precursor molecule of a graphene nanoribbon. FIG. 6B indicates another example of a polymer (polymer chain) of the precursor molecule. FIG. 6C illustrates another example of a graphene nanoribbon.

In this case, for example, a precursor molecule 10B having a structure illustrated in FIG. 6A is used for forming a graphene nanoribbon 30B. The precursor molecule 10B illustrated in FIG. 6A has a structure in which X and Q in formula (2) are a bromine atom Br and an oxygen atom O respectively and in which the polymerization degree s is 0. The precursor molecule 10B contains a carboxylic acid anhydride structure 10c. This precursor molecule 10B is used and the bottom-up synthesis is performed.

With the bottom-up synthesis, the precursor molecule 10B is vacuum-deposited over a catalytic metal substrate, such as an Au (111) plane, purified in an ultrahigh vacuum and kept at a temperature of about 200 to 300° C. At this time a deposition amount is controlled so that about one-molecule layer, for example, will be formed. Polymerization of precursor molecules 10B progresses over the Au (111) plane by a dehydrohalogenation reaction by which hydrogen bromide HBr is separated from adsorbed precursor molecules 10B. As a result, a polymer 20B illustrated in FIG. 6B is formed.

After the above vacuum deposition, the Au (111) plane over which the polymer 20B is formed is heated in a vacuum at a higher temperature of about 350 to 450° C. This high temperature heating causes in the polymer 20B over the Au (111) plane a dehydrogenation reaction by which hydrogen $H_2$ is separated from precursor molecules 10B, and aromatization progress. As a result, the graphene nanoribbon 30B illustrated in FIG. 6C is formed.

The graphene nanoribbon 30B illustrated in FIG. 6C has a chiral edge 34 at which two benzene rings of a naphthalene structure part 10a of the precursor molecule 10B and one benzene ring formed by aromatization of precursor molecules 10B are arranged alternately and periodically. The carboxylic acid anhydride structure 10c is bonded to the two benzene rings of the naphthalene structure part 10a. The carboxylic acid anhydride structure 10c is periodically bonded to a carbon atom of the chiral edge 34 via a plurality of (three, in this example) carbon atoms. The angle of the chiral edge 34 of the graphene nanoribbon 30B is 10.8°.

A small band gap is realized by the graphene nanoribbon 30B, compared with a graphene nanoribbon having an armchair edge and approximately the same width. Alternatively, a small width is realized by the (2, 1)-DCI-GNR, compared with an AGNR whose band gap is approximately the same. Therefore, a relatively small precursor molecule 10B may be used in the bottom-up synthesis.

Furthermore, a work function of the graphene nanoribbon 30B increases due to the electron-withdrawing property of the carboxylic acid anhydride structure 10c. Therefore, n-type operation is easily realized by connecting as an electrode metal whose work function is comparatively low.

Furthermore, the stability of a reaction intermediate is improved by the electron-withdrawing property of the carboxylic acid anhydride structure 10c. As a result, the ribbon length of the graphene nanoribbon 30B increases and a polymerization defect is corrected.

In addition, the carboxylic acid anhydride structure 10c contains an oxygen atom O which is an acceptor of a hydrogen bond. As a result, the orientation of graphene nanoribbons 30B is improved by self-organization based on a hydrogen bond.

As has been described, with the small width graphene nanoribbon 30B according to the third embodiment, a small bang gap is realized. Furthermore, n-type operation is realized by the electron-withdrawing property of the carboxylic acid anhydride structure 10c. This is the same with the above graphene nanoribbon 30A. In addition, the graphene nanoribbon 30B with long ribbon length and good orientation in which a polymerization defect is suppressed is realized by the carboxylic acid anhydride structure 10c.

The graphene nanoribbon 30B having the above characteristics is excellent in applicability to various semiconductor devices.

A fourth embodiment will now be described.

An example in which the graphene nanoribbon according to the above first embodiment represented by formula (1) or the graphene nanoribbon 30A or 30B according to the above second or third embodiment is used in various semiconductor devices will now be described as a fourth embodiment.

Figure 7:
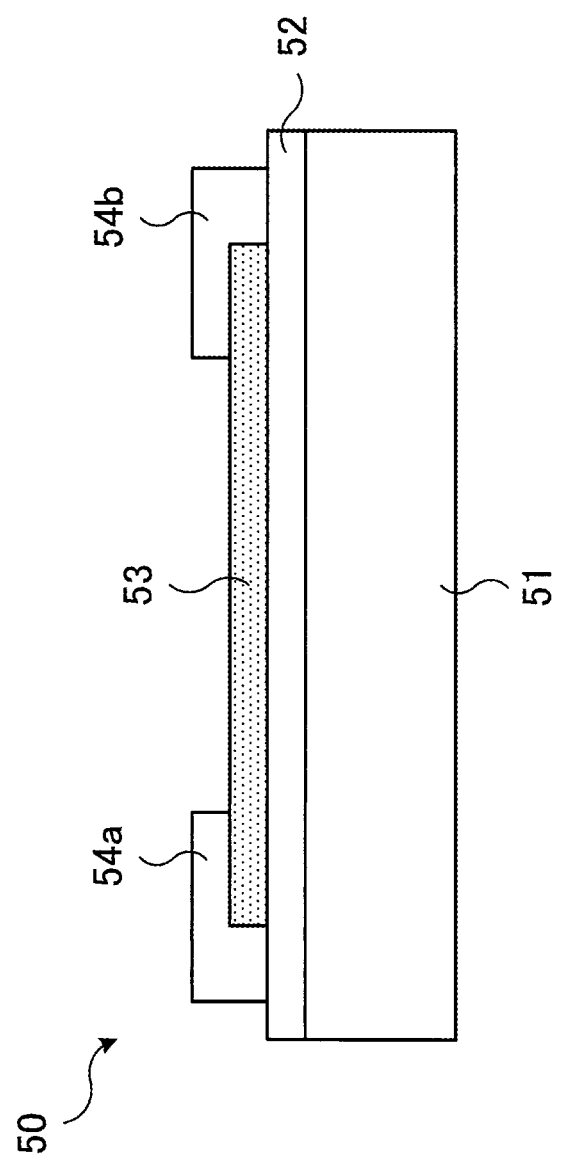
FIG. 7 illustrates a first example of a semiconductor device.

FIG. 7 illustrates a first example of a semiconductor device. FIG. 7 schematically illustrates a sectional view of the semiconductor device.

A semiconductor device 50 illustrated in FIG. 7 is an example of a bottom gate type FET. The semiconductor device 50 includes a gate electrode 51, a gate insulating film 52, a graphene nanoribbon 53, an electrode 54a, and an electrode 54b.

A conductive substrate is used as the gate electrode 51. For example, a semiconductor substrate, such as a silicon (Si) substrate, doped with an impurity element of a determined conduction type is used. The gate insulating film 52 is formed over this gate electrode 51. An insulating material, such as silicon oxide (SiO), is used for forming the gate insulating film 52.

The graphene nanoribbon according to the above first embodiment represented by formula (1) and having the chiral edge or the graphene nanoribbon 30A or 30B according to the above second or third embodiment having the chiral edge 34 is used as the graphene nanoribbon 53. In this case, for example, the graphene nanoribbon 53 is formed by transferring the graphene nanoribbon formed by the bottom-up synthesis described in the above first, second, or third embodiment over the gate insulating film 52 over the gate electrode 51.

The electrode 54a and the electrode 54b are formed over one end portion and the other end portion, respectively, of the graphene nanoribbon 53 formed over the gate insulating film 52. The electrode 54a and the electrode 54b are formed by the use of metal such as Ti, chromium (Cr), cobalt (Co), nickel (Ni), palladium (Pd), aluminum (Al), Cu, Ag, platinum (Pt), or Au.

With the semiconductor device 50 which is a bottom gate type FET, the graphene nanoribbon 53 is used as a channel. An on state and an off state of the graphene nanoribbon 53 which connects the electrode 54a and the electrode 54b, that is to say, of the channel are controlled by controlling the potential of the gate electrode 51. A high-speed FET is realized by making use of high carrier mobility of the graphene nanoribbon 53.

A graphene nanoribbon having a chiral edge and a band gap suitable for an FET is used as the graphene nanoribbon 53 of the semiconductor device 50. An electron-withdrawing group bonded to the chiral edge enables n-type operation of the graphene nanoribbon 53. Furthermore, the graphene nanoribbon 53 with proper ribbon length and good orientation in which a polymerization defect is suppressed is formed over the gate insulating film 52 by the effect of the electron-withdrawing group. In addition, it is possible to connect this graphene nanoribbon 53 and the electrode 54a and the electrode 54b, while ensuring a contact area by the proper ribbon length and suppressing an increase in contact resistance.

A high performance semiconductor device 50 using the graphene nanoribbon 53 having the chiral edge to which the electron-withdrawing group is bonded is realized.

The resistance of the graphene nanoribbon 53 changes at the time of adsorbing a molecule. The semiconductor device 50 illustrated in FIG. 7 may also be used as an FET-type gas sensor by utilizing this property of the graphene nanoribbon 53. With the semiconductor device 50 used as the FET-type gas sensor, a change in the relationship at the time of the graphene nanoribbon 53 adsorbing a gas between a current flowing between the electrode 54a and the electrode 54b and a voltage of the gate electrode 51 is measured. An FET-type gas sensor having high sensitivity is realized by the use of the graphene nanoribbon 53.

Figure 8:
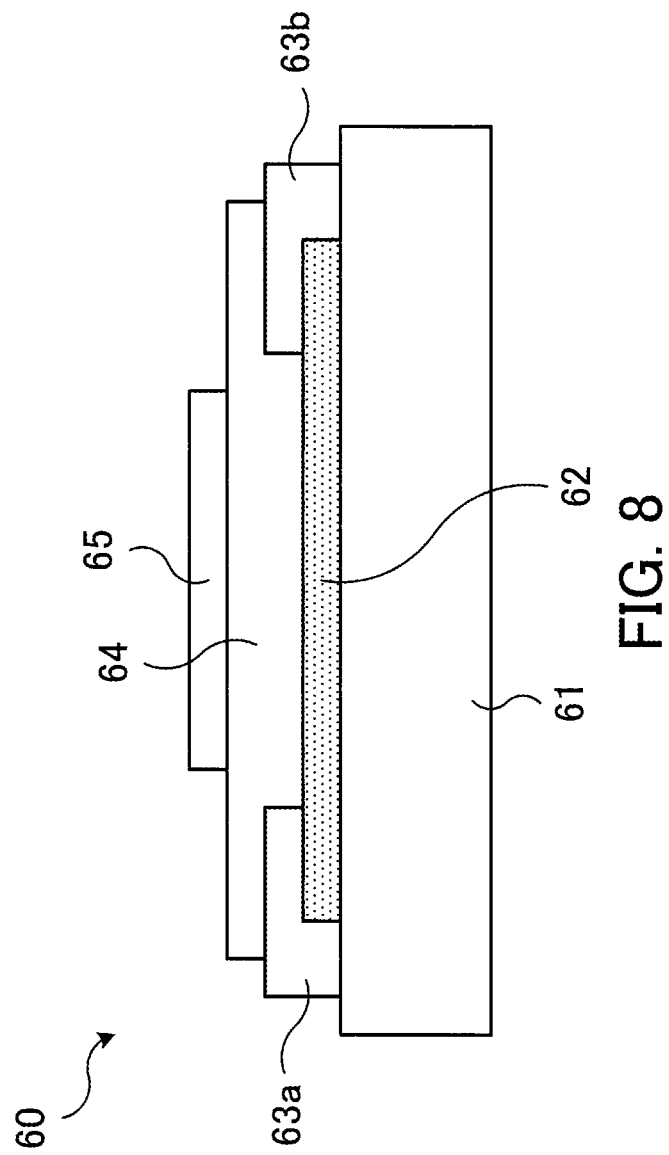
FIG. 8 illustrates a second example of a semiconductor device.

FIG. 8 illustrates a second example of a semiconductor device. FIG. 8 schematically illustrates a sectional view of the semiconductor device.

A semiconductor device 60 illustrated in FIG. 8 is an example of a top gate type FET. The semiconductor device 60 includes a support substrate 61, a graphene nanoribbon 62, an electrode 63a, an electrode 63b, a gate insulating film 64, and a gate electrode 65.

An insulating substrate, such as a sapphire substrate, is used as the support substrate 61. A substrate at least whose surface layer is formed by the use of an inorganic or organic insulating material is used as the support substrate 61. The graphene nanoribbon 62 is formed over the support substrate 61.

The graphene nanoribbon according to the above first embodiment represented by formula (1) and having the chiral edge or the graphene nanoribbon 30A or 30B according to the above second or third embodiment having the chiral edge 34 is used as the graphene nanoribbon 62. In this case, for example, the graphene nanoribbon 62 is formed by transferring over the support substrate 61 the graphene nanoribbon formed by the bottom-up synthesis described in the above first, second, or third embodiment.

The electrode 63a and the electrode 63b are formed over one end portion and the other end portion, respectively, of the graphene nanoribbon 62 formed over the support substrate 61. The electrode 63a and the electrode 63b are formed by the use of metal such as Ti, Cr, Co, Ni, Pd, Al, Cu, Ag, Pt, or Au.

The gate electrode 65 is formed over the graphene nanoribbon 62 between the electrode 63a and electrode 63b with the gate insulating film 64 therebetween. The gate insulating film 64 is formed by the use of an insulating material such as SiO. The gate electrode 65 is formed by the use of polycrystalline silicon or a conductor material such as metal.

With the semiconductor device 60 which is a top gate type FET, the graphene nanoribbon 62 is used as a channel. An on state and an off state of the graphene nanoribbon 62 which connects the electrode 63a and the electrode 63b, that is to say, of the channel are controlled by controlling the potential of the gate electrode 65. A high-speed FET is realized by making use of high carrier mobility of the graphene nanoribbon 62.

A graphene nanoribbon having a chiral edge and a band gap suitable for an FET is used as the graphene nanoribbon 62 of the semiconductor device 60. An electron-withdrawing group bonded to the chiral edge enables n-type operation of the graphene nanoribbon 62. Furthermore, the graphene nanoribbon 62 with proper ribbon length and good orientation in which a polymerization defect is suppressed is formed over the support substrate 61 by the effect of the electron-withdrawing group. In addition, it is possible to connect this graphene nanoribbon 62 and the electrode 63a and the electrode 63b, while ensuring a contact area by proper ribbon length and suppressing an increase in contact resistance.

A high performance semiconductor device 60 using the graphene nanoribbon 62 having the chiral edge to which the electron-withdrawing group is bonded is realized.

Figure 9:
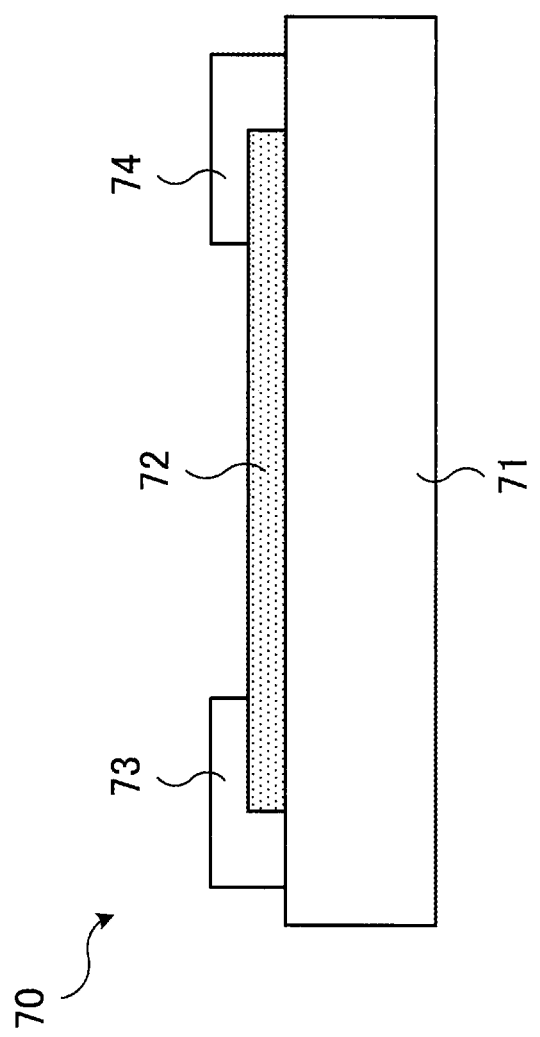
FIG. 9 illustrates a third example of a semiconductor device.

FIG. 9 illustrates a third example of a semiconductor device. FIG. 9 schematically illustrates a sectional view of the semiconductor device.

A semiconductor device 70 illustrated in FIG. 9 is an example of a Schottky barrier diode. The semiconductor device 70 includes a support substrate 71, a graphene nanoribbon 72, an electrode 73, and an electrode 74.

An insulating substrate, such as a sapphire substrate, is used as the support substrate 71. A substrate at least whose surface layer is formed by the use of an inorganic or organic insulating material is used as the support substrate 71. The graphene nanoribbon 72 is formed over the support substrate 71.

The graphene nanoribbon according to the above first embodiment represented by formula (1) and having the chiral edge or the graphene nanoribbon 30A or 30B according to the above second or third embodiment having the chiral edge 34 is used as the graphene nanoribbon 72. In this case, for example, the graphene nanoribbon 72 is formed by transferring over the support substrate 71 the graphene nanoribbon formed by the bottom-up synthesis described in the above first, second, or third embodiment.

The electrode 73 and the electrode 74 are formed over one end portion and the other end portion, respectively, of the graphene nanoribbon 72 formed over the support substrate 71. The electrode 73 is formed by the use of metal, such as Cr, which forms a Schottky connection with the graphene nanoribbon 72. The electrode 74 is formed by the use of metal, such as Ti, which forms an ohmic connection with the graphene nanoribbon 72.

A graphene nanoribbon having a chiral edge and a band gap suitable for a Schottky barrier diode is used as the graphene nanoribbon 72 of the semiconductor device 70. An electron-withdrawing group bonded to the chiral edge enables n-type operation of the graphene nanoribbon 72. Furthermore, the graphene nanoribbon 72 with proper ribbon length and good orientation in which a polymerization defect is suppressed is formed over the support substrate by the effect of the electron-withdrawing group. In addition, it is possible to connect this graphene nanoribbon 72 and the electrode 73 and the electrode 74, while ensuring a contact area by proper ribbon length and suppressing an increase in contact resistance.

With the semiconductor device 70, the graphene nanoribbon 72 having the chiral edge to which the electron-withdrawing group is bonded is used, a Schottky connection with the electrode 73 is realized on the one end portion side, and an ohmic connection with the electrode 74 is realized on the other end portion side. As a result, a Schottky barrier diode having excellent diode characteristics is realized.

The above graphene nanoribbon 53, 62, or 72 may be formed over a material having the function of doping it, for example, over what is called a self-assembled monolayer (SAM).

A graphene nanoribbon obtained by connecting graphene nanoribbons of different widths each having a chiral edge to which an electron-withdrawing group is bonded may be used as the above graphene nanoribbon 53, 62, or 72. Furthermore, a graphene nanoribbon obtained by connecting a graphene nanoribbon having a chiral edge to which an electron-withdrawing group is bonded and a graphene nanoribbon having an armchair edge or a graphene nanoribbon whose edge is terminated with a functional group may be used as the above graphene nanoribbon 53, 62, or 72. In any of these cases, parts which differ in band gap or work function are formed in the graphene nanoribbon 53, 62, or 72. On the basis of the structure of the connected electrodes 54a and 54b, electrodes 63a and 63b, or electrodes 73 and 74, for example, contact resistance or barrier height is controlled by the use of the graphene nanoribbon 53, 62, or 72 including these parts.

Figure 10:
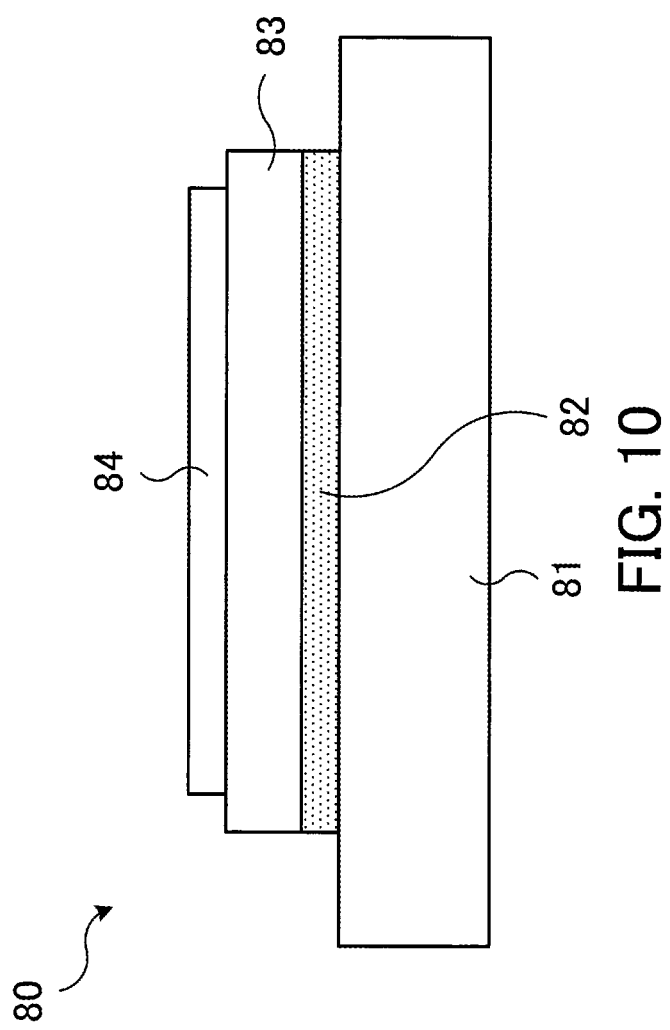
FIG. 10 illustrates a fourth example of a semiconductor device.

Furthermore, FIG. 10 illustrates a fourth example of a semiconductor device. FIG. 10 schematically illustrates a sectional view of the semiconductor device.

A semiconductor device 80 illustrated in FIG. 10 is an example of a laminated solar cell. The semiconductor device 80 includes a lower electrode 81, a graphene nanoribbon 82, a carrier transport layer 83, and an upper electrode 84.

The lower electrode 81 and the upper electrode 84 are formed by the use of a transparent conductor material such as indium tin oxide. Alternatively, one (lower electrode 81, for example) of the lower electrode 81 and the upper electrode 84 is formed by the use of a transparent conductor material and the other (upper electrode 84, for example) of the lower electrode 81 and the upper electrode 84 is formed by the use of an opaque conductor material such as metal.

A quantum dot structure laminate or an organic semiconductor material laminate including a pn junction is used as the carrier transport layer 83 formed between the lower electrode 81 and the upper electrode 84. For example, the graphene nanoribbon 82 is formed between the lower electrode 81 and the carrier transport layer 83.

The graphene nanoribbon according to the above first embodiment represented by formula (1) and having the chiral edge or the graphene nanoribbon 30A or 30B according to the above second or third embodiment having the chiral edge 34 is used as the graphene nanoribbon 82.

In the semiconductor device 80, electricity is generated as electrons and holes produced in response to incident light at a pn junction interface in the carrier transport layer 83 reach, for example, the lower electrode 81 and the upper electrode 84 respectively. In this case, the graphene nanoribbon 82 formed between the carrier transport layer 83 and the lower electrode 81 improves the efficiency of extracting electrons to the lower electrode 81 or controls the work function of the lower electrode 81. Furthermore, the graphene nanoribbon 82, together with the lower electrode 81, may be used as part of a lower electrode of a laminated solar cell.

A graphene nanoribbon having a chiral edge and a work function suitable for a laminated solar cell is used as the graphene nanoribbon 82 of the semiconductor device 80. An electron-withdrawing group bonded to the chiral edge enables n-type operation of the graphene nanoribbon 82. Furthermore, the graphene nanoribbon 82 with proper ribbon length and good orientation in which a polymerization defect is suppressed is formed between the lower electrode 81 and the carrier transport layer 83 by the effect of the electron-withdrawing group.

A graphene nanoribbon which improves the efficiency of extracting holes to the upper electrode 84 or which controls the work function of the upper electrode 84 may be formed between the carrier transport layer 83 and the upper electrode 84. Furthermore, the graphene nanoribbon, together with the upper electrode 84, may be used as part of an upper electrode of a laminated solar cell.

A fifth embodiment will now be described.

Various electronic devices (electronic equipment or electronic apparatus) may be equipped with the semiconductor devices 50, 60, 70, 80, and the like according to the above fourth embodiment. For example, the semiconductor devices 50, 60, 70, 80, and the like may be used in various electronic devices such as computers (personal computers, supercomputers, servers, and the like), smartphones, portable telephones, tablet terminals, sensors, cameras, audio equipment, measuring equipment, inspection equipment, and manufacturing equipment.

Figure 11:
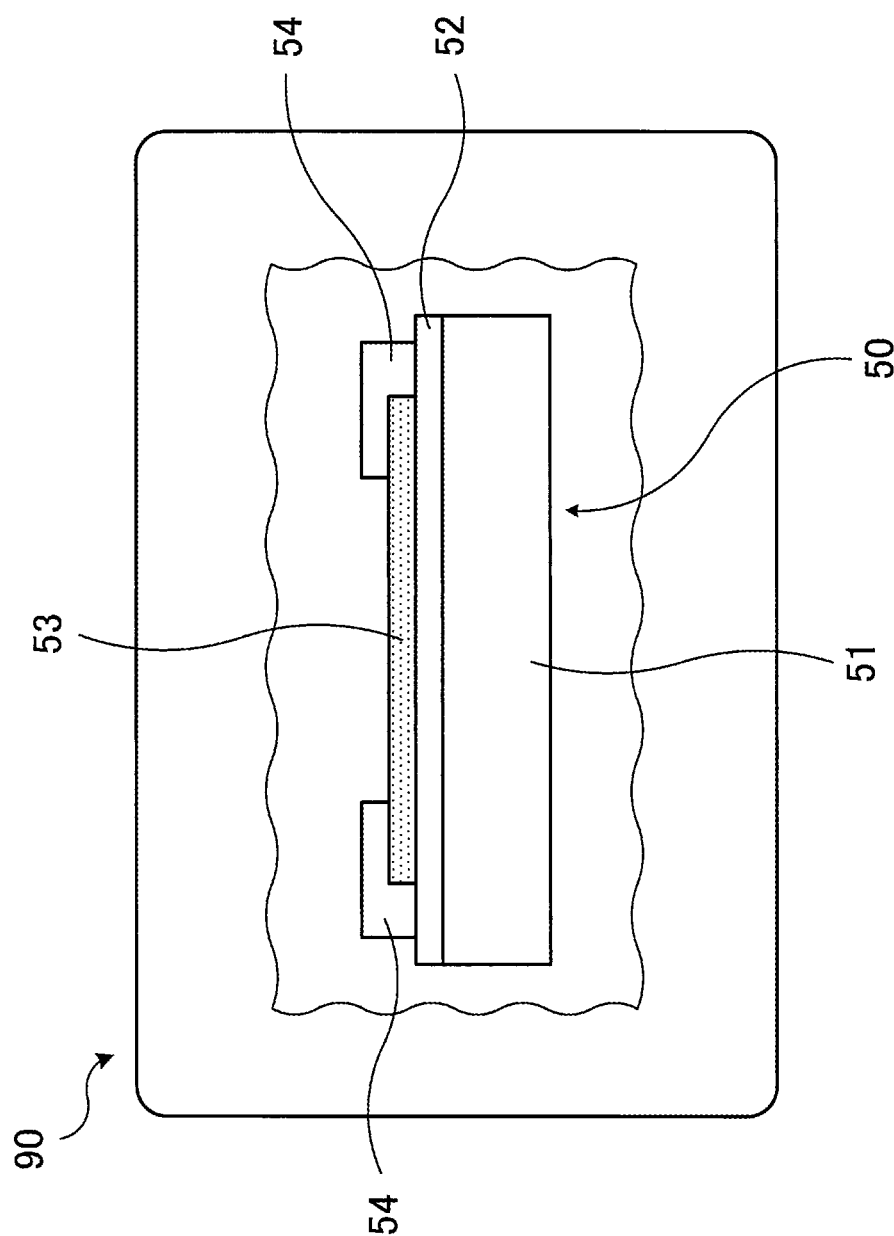
FIG. 11 is a view for describing an electronic device.

FIG. 11 is a view for describing an electronic device. FIG. 11 is a schematic view of an example of the electronic device.

As illustrated in FIG. 11, for example, the semiconductor device 50 illustrated in FIG. 7 is carried by (incorporated in) an electronic device 90. With the semiconductor device 50, as stated above, the graphene nanoribbon 53 having a chiral edge to which an electron-withdrawing group is bonded is used. Characteristics, such as a band gap, a work function, ribbon length, orientation, and contact resistance, needed for the graphene nanoribbon of the semiconductor device 50 are satisfied by the chiral edge and the electron-withdrawing group bonded thereto. As a result, a high performance semiconductor device 50 using the graphene nanoribbon 53 is realized and a high performance electronic device 90 which carries such a semiconductor device 50 is realized.

The semiconductor device 50 illustrated in FIG. 7 is taken as an example. However, the other semiconductor devices 60, 70, 80, and the like are also carried by various electronic devices.

A graphene nanoribbon excellent in applicability to a semiconductor device is realized. Furthermore, a high performance semiconductor device using such a graphene nanoribbon is realized.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:
1. A graphene nanoribbon comprising:
a chiral edge extending in a length direction of the graphene nanoribbon;

electron-withdrawing groups bonded to the chiral edge, wherein the electron-withdrawing groups are periodically bonded to the chiral edge via a plurality of first carbon atoms of the chiral edge between second carbon atoms of the chiral edge to which adjacent ones of the electron-withdrawing groups are bonded.

2. The graphene nanoribbon according to claim 1, wherein the electron-withdrawing groups each contain an imide structure bonded to the chiral edge.

3. The graphene nanoribbon according to claim 1, wherein the electron-withdrawing groups each contain an acid anhydride structure bonded to the chiral edge.

4. The graphene nanoribbon according to claim 1, wherein when an angle of an armchair edge is 0°, an angle of the chiral edge is 10.8°.

* * * * *